United States Patent [19]

Tsumura et al.

[11] Patent Number: 5,003,373
[45] Date of Patent: Mar. 26, 1991

[54] STRUCTURE OF ELECTRODE JUNCTION FOR SEMICONDUCTOR DEVICE

[75] Inventors: Kiyoaki Tsumura; Hitoshi Fujimoto, both of Itami, Japan

[73] Assignee: Mitsubishi Denki Kabushiki Kaisha, Japan

[21] Appl. No.: 262,804

[22] Filed: Oct. 26, 1988

[30] Foreign Application Priority Data

Nov. 30, 1987 [JP] Japan .................. 62-301750

[51] Int. Cl.$^5$ ............................. B23K 20/10
[52] U.S. Cl. ...................... 357/67; 357/85; 228/110; 228/111
[58] Field of Search ............... 357/68, 67, 71; 219/56.22

[56] References Cited

U.S. PATENT DOCUMENTS

| 4,096,988 | 6/1978 | Beilein et al. ............ 357/80 |
| 4,258,382 | 3/1981 | Harris ..................... 357/68 |
| 4,290,079 | 9/1981 | Carpenter et al. .......... 357/68 |
| 4,345,136 | 8/1982 | Nippert ................... 219/85.1 |
| 4,463,059 | 7/1984 | Bhattacharya ............. 357/71 R |
| 4,472,730 | 9/1984 | Ohta ...................... 357/54 |
| 4,486,945 | 12/1984 | Aigoo .................... 357/71 R |
| 4,705,204 | 11/1987 | Hirota et al. ............ 219/56.22 |
| 4,742,014 | 5/1988 | Hooper et al. ............ 437/198 |
| 4,821,944 | 4/1989 | Tsumura .................. 219/85.18 |
| 4,886,200 | 12/1989 | Tsumura .................. 228/110 |

FOREIGN PATENT DOCUMENTS

| 0271110 | 6/1988 | European Pat. Off. . |
| 55-98827 | 7/1980 | Japan . |
| 59-3953 | 1/1984 | Japan . |
| 0198746 | 11/1984 | Japan . |
| 0154631 | 8/1985 | Japan . |
| 61-199645 | 9/1986 | Japan . |
| 62-150730 | 7/1987 | Japan . |
| 62-206857 | 9/1987 | Japan . |
| 62-249436 | 10/1987 | Japan . |

Primary Examiner—Andrew J. James
Assistant Examiner—Viet Q. Nguyen
Attorney, Agent, or Firm—Leydig, Voit & Mayer

[57] ABSTRACT

A structure of an electrode junction for a semiconductor device comprises an insulating film covering the entire surface of a silicon substrate, an aluminum electrode layer which is formed on the insulating film, a copper ball bonded on the electrode layer, and a copper-aluminum alloy layer continuously formed from the copper ball to the aluminum electrode layer. The aluminum layer under the copper ball is not separated from the aluminum layer surrounding the copper ball, so that alloy layer deterioration along the periphery thereof does not cause the electrical resistance to increase. This structure will increase the device life time to the maximum level.

7 Claims, 6 Drawing Sheets

STRUCTURE OF ELECTRODE JUNCTION FOR SEMICONDUCTOR DEVICE

BACKGROUND OF THE INVENTION

1. Field of the Invention

The present invention relates to a structure of a junction between a copper ball and an aluminum electrode when a copper wire is employed.

2. Description of the Related Art

FIG. 1 is a cross-sectional view illustrating a conventional structure of wire bonding of a copper wire, while FIG. 2 is a diagram illustrating the distribution of aluminum after a wire-bonded copper ball and a layer of copper-aluminum alloy are etched with nitric acid.

In these diagrams, a layer of a copper-aluminum alloy (hereinafter simply referred to as an alloy layer) 3 is produced under a copper ball 1 at the time of bonding, and this alloy layer 3 separates aluminum 21 of an electrode 2 underneath the copper ball 1 from aluminum 22 around the copper ball 1. An insulating layer 4, which is formed of an oxide, nitride, or the like, constitutes a substrate of the aluminum electrode 2.

In FIGS. 1 and 2, the alloy layer 3 is produced by ultrathermosonic compression bonding, that is the copper ball 1, which is formed at the end of the copper wire using heat energy, is pressed against the aluminum electrode 2 which is heated to 300°–400° C. This alloy layer 3 has a mechanical strength which is greater than that of the copper ball 1. At this time, the aluminum electrode 2 is plastically deformed by the pressure of the copper ball 1, so that the aluminum electrode 2 is separated into the aluminum 21 underneath the copper ball 1 and the aluminum 22 around the copper ball 1. Consequently, the electrical connection to the device is obtained only at the junction between the ally layer 3 and the aluminum 22 around the copper ball 1. Incidentally, this contact and the associated device are subsequently encapsulated with an epoxy-resin.

Thus, in the conventional structure of an electrode junction for a semiconductor device, since the electric connection is obtained only at the junction between the alloy layer 3 and the aluminum 22 around the copper ball 1, there has been a problem. If the circumferential portion of the alloy layer 3 bonded to the aluminum 22 around the copper ball 1 deteriorates even slightly, the electrical resistance of the contact exceeds a maximum acceptable value and ends the life of the device.

SUMMARY OF THE INVENTION

In view of the above-described problem of the conventional art, an object of the present invention is to provide an electrode junction structure for a semiconductor device which can slow down the rate of increase in the electrical resistance between a copper ball and an aluminum electrode, so that the life time of the device can be increased.

To this end, the present invention provides an electrode junction structure for a semiconductor device comprising: an insulating film covering the entire silicon substrate; an aluminum electrode layer formed on the insulating film; a copper ball bonded on the electrode layer; and a copper-aluminum alloy layer continuously formed from the copper ball to the aluminum electrode layer. The most specific character of this structure is that the aluminum layer under the copper ball is not separated as an island from the aluminum layer surrounding the copper ball.

The copper-aluminum alloy layer and the aluminum layer in accordance with the present invention have large contact areas underneath the copper ball, and the time until the electrical resistance increases to exceed a maximum acceptable value due to the corrosion of the copper-aluminum alloy layer, i.e., the life of a device, can be made longer.

The above and other objects, features and advantages of the present invention will become apparent from the following description of the invention when read in conjunction with the accompanying drawings.

DESCRIPTION OF THE PREFERRED EMBODIMENT

Referring now to the accompanying drawings, a description will be given of a preferred embodiment of the present invention.

Figure 3:
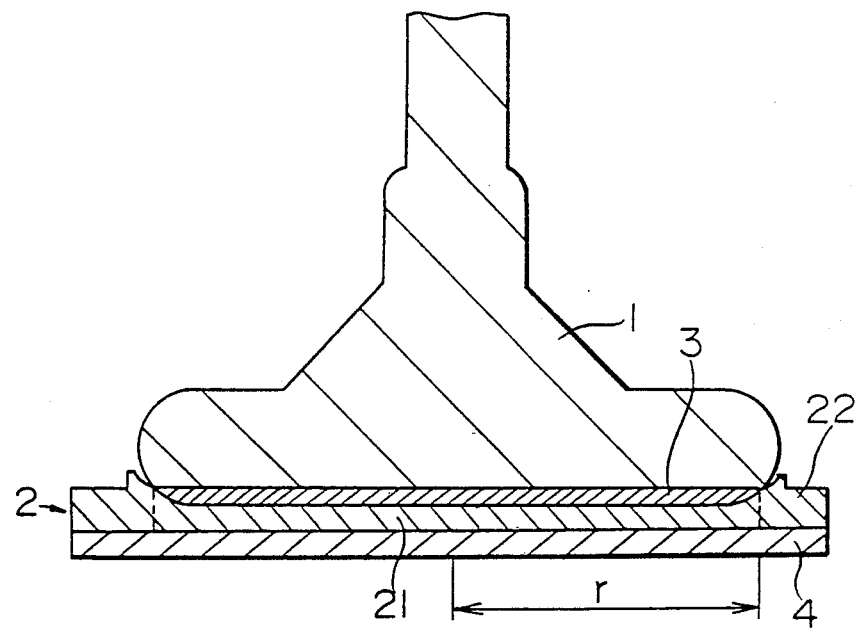
FIG. 3 is a cross-sectional view of a bonding structure of a copper wire in accordance with an embodiment of the present invention.

In FIG. 3, in a bonding structure of a copper wire in accordance with this embodiment, a copper-aluminum alloy layer 3 is formed in the entire area of the interface between a copper ball 1 and an aluminum electrode 2. In addition, this alloy layer 3 and aluminum layer 21 underneath the copper ball 1 are bonded to each other over substantially the entire area, and the aluminum layer 21 is connected to the aluminum layer 22 around the copper ball 1. An insulating film 4 which constitutes a substrate for the aluminum electrode 2 is formed underneath the aluminum 21 and 22.

Figure 4:
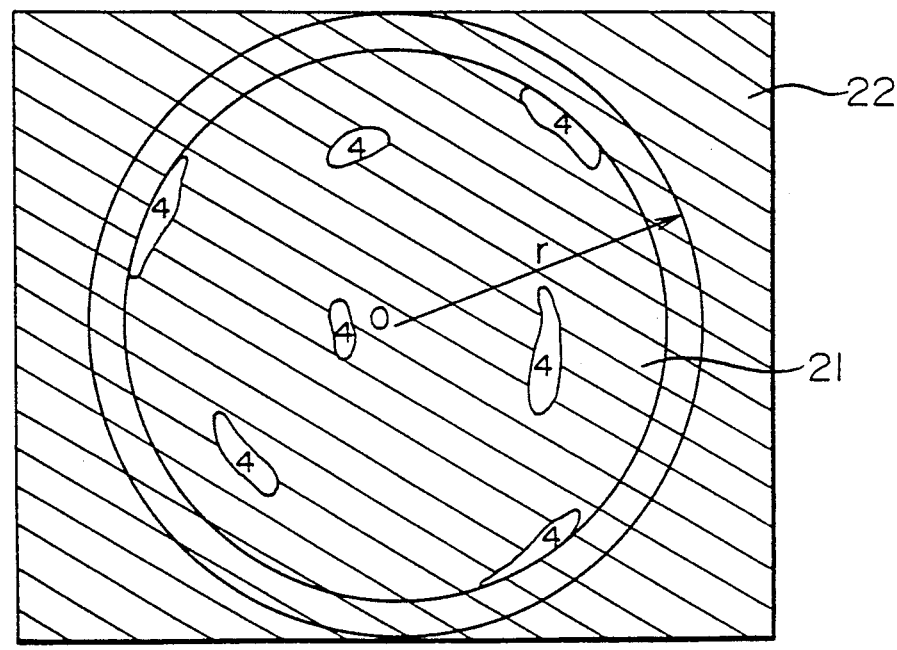
FIG. 4 is a diagram illustrating the distribution of aluminum after etching of a copper ball and an alloy layer both shown in FIG. 3.

FIG. 4 shows the distribution of aluminum in a case where the copper ball 1 and the alloy layer 3 are removed by subjecting the bonded portion shown in FIG. 3 to etching with nitric acid. In the very small areas where the insulating film 4 is exposed, all of the aluminum 21 underneath the copper ball 1 has been converted into the alloy layer 3. The drawing shows that the aluminum 21 is distributed over substantially the entire area excluding those small areas where insulating layer 4 is exposed. Aluminum 21 is distributed over not less than eighty percent of the area underneath copper ball 1 and is not separated from the surrounding aluminum 22 but is continuous therewith.

A description will now be given of a specific method for obtaining the bonding structure such as the one shown in FIG. 3.

Figure 5A:
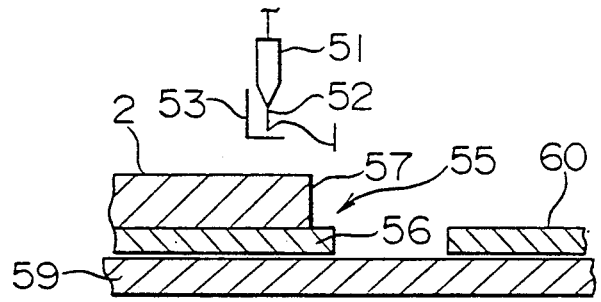
FIGS. 5A to 5E show the processes of a wire bonding method for forming the bonding structure of the embodiment.
Figure 5B:
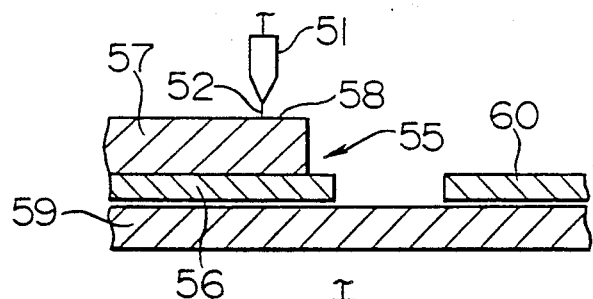

First, as shown in FIG. 5A, a copper wire 52 whose diameter is 25-30 μm passes through a capillary tip 51. A copper ball 1 is formed at the end of wire 52 by a discharge energy of a torch electrode 53. Subsequently, as shown in FIG. 5B, the capillary tip 51 is lowered to press the copper ball with a 130 g load against the aluminum electrode 2 of a semiconductor chip 57 bonded to a die pad 56 of a copper-based lead frame 55, whereby the copper ball 1 is plastically deformed. At this time, the die pad 56 is placed on a heat block 59, and the semiconductor chip 57 is heated to a temperature ranging from 300° to 400° C. by this heat block 59. The copper ball 1 is pressed for 200 to 400 msec by the capillary tip 51.

Figure 6:
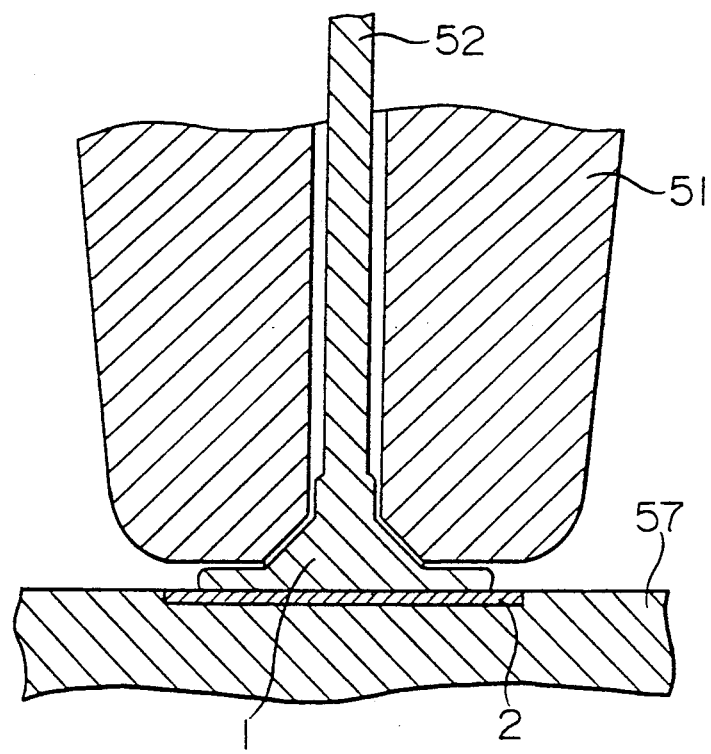
FIGS. 6 and 7 are cross-sectional views respectively illustrating an end portion of a capillary tip shown in FIGS. 5B and 5D.

Owing to the thermal energy from the heat block 59 and the pressure applied by the capillary tip 51, both of metallic elements of the copper ball 1 and the aluminum electrode 2 are mutually diffused to form a copper-aluminum alloy layer, so that the copper ball 1 is bonded to the aluminum electrode 2. FIG. 6 shows an enlarged cross-sectional view around the end portion of the capillary tip 51 at that time.

Figure 5C:
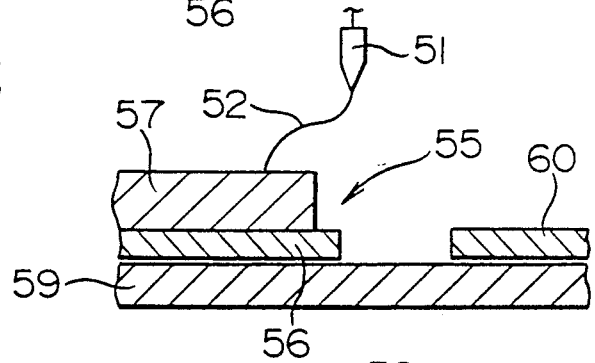
Figure 5D:
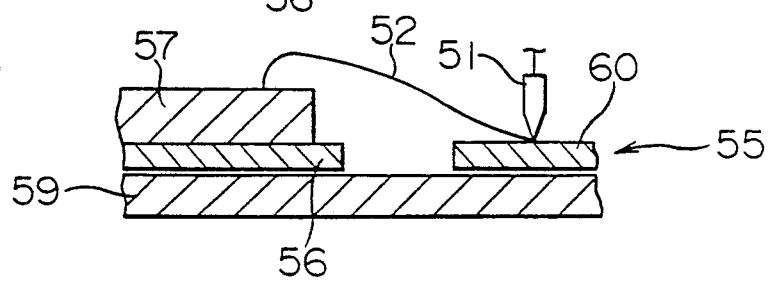
Figure 7:
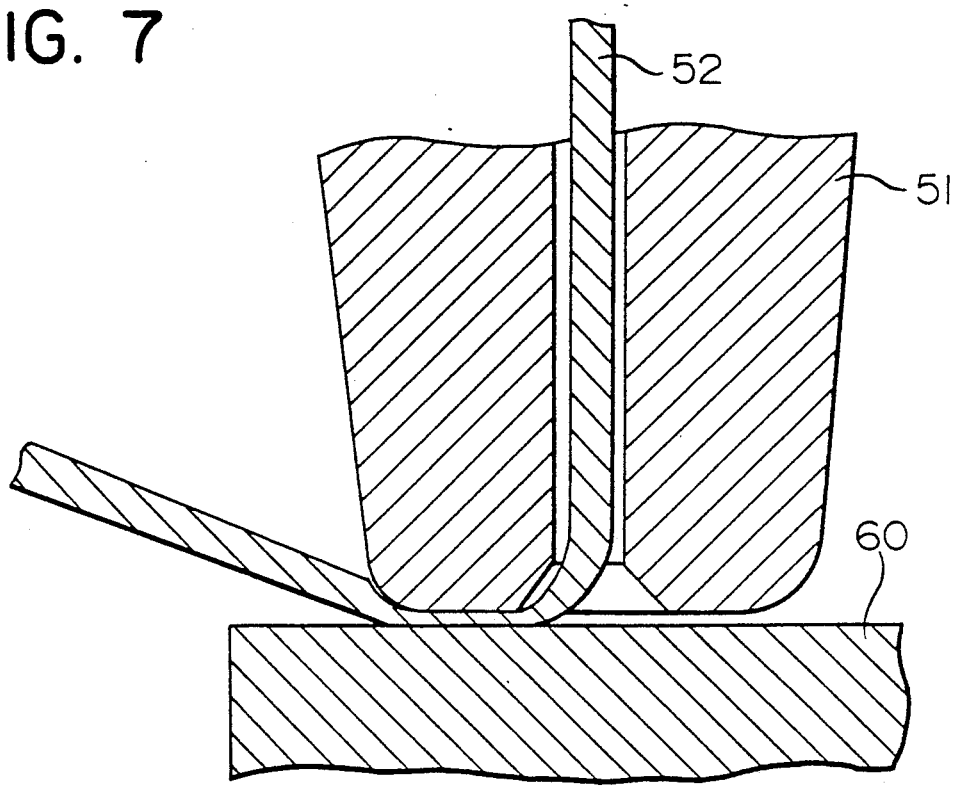

Subsequently, copper wire 52 is fed through the capillary tip 51 while the capillary tip 51 is being raised, as shown in FIG. 5C. The capillary tip 51 is moved over and down to an inner lead 60 of a lead frame 55, as shown in FIG. 5D, and the copper wire 52 is plastically deformed at the surface of the inner lead 60 by being pressed with a 130 g load. At this time, the inner lead 60 is placed on the heat block 59, and is heated to a temperature ranging from 300° to 400° C. Ultrasonic vibrations with a frequency of 60 kHz are applied to the deformed copper wire 52 via the capillary tip 51 for 40 msec by means of a vibrating device (not shown) while the copper wire 52 is pressed, whereby both metallic elements of the copper wire 52 and the inner lead 60 are mutually diffused to form a copper-copper alloy layer, so that the copper wire 52 is bonded to the inner lead 60. FIG. 7 is an enlarged cross-sectional view around the end portion of the capillary tip 51 at that time.

Figure 5E:
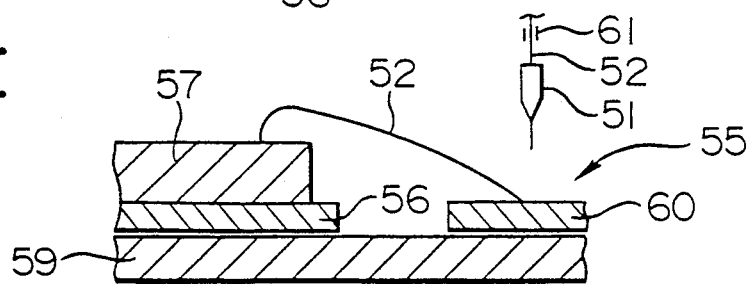

Subsequently, as shown in FIG. 5E, with the copper wire 52 clamped by the clamper 61, the capillary tip 51 and the clamper 61 are raised, whereby the copper wire 52 is pulled by the clamper 61 to sever the wire 52.

Namely, by using thermocompression bonding which mainly employs thermal energy and pressure instead of conventionally used ultrasonic thermocompression bonding, it is possible to obtain a bonding structure such as the one shown in FIG. 3. In this case, ultrasonic energy is not applied at all, or, if applied, only a small amount is applied as compared with the thermal energy.

As shown in FIG. 3, the alloy layer 3 is formed between the copper ball 1 and the aluminum electrode 2, and the aluminum 21 is bonded over essentially the entire area typically at least 80% of the area of the alloy layer 3. It will therefore take a long time until the electrical resistance of the junction increases beyond the maximum acceptable value as compared with a conventional structure.

Figure 1:
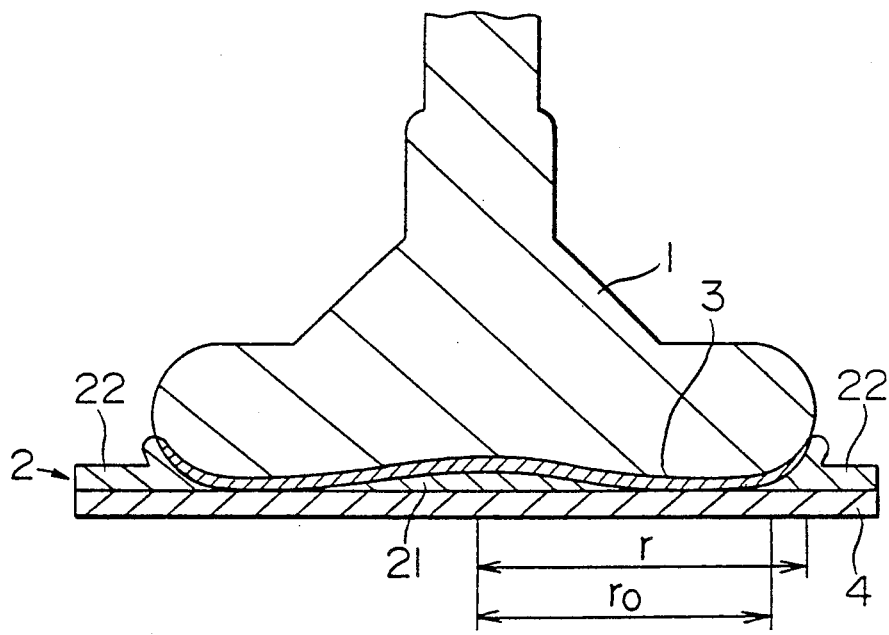
FIG. 1 is a cross-sectional view of a conventional bonding structure of a copper wire.
Figure 2:
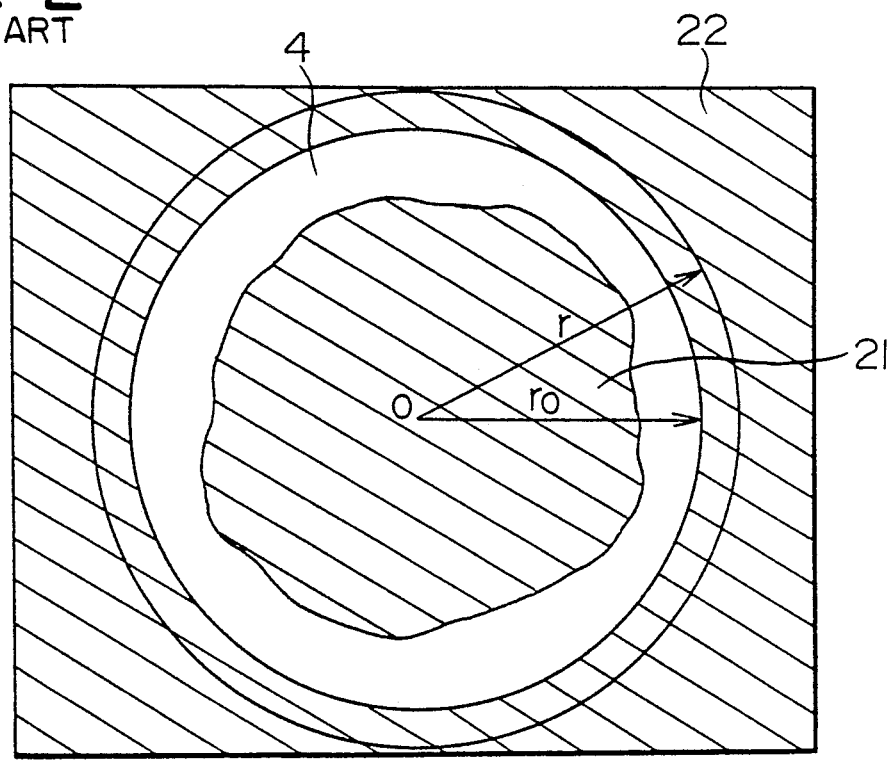
FIG. 2 is a diagram illustrating the distribution of aluminum of a copper ball and an alloy layer both shown in FIG. 1.
Figure 8:
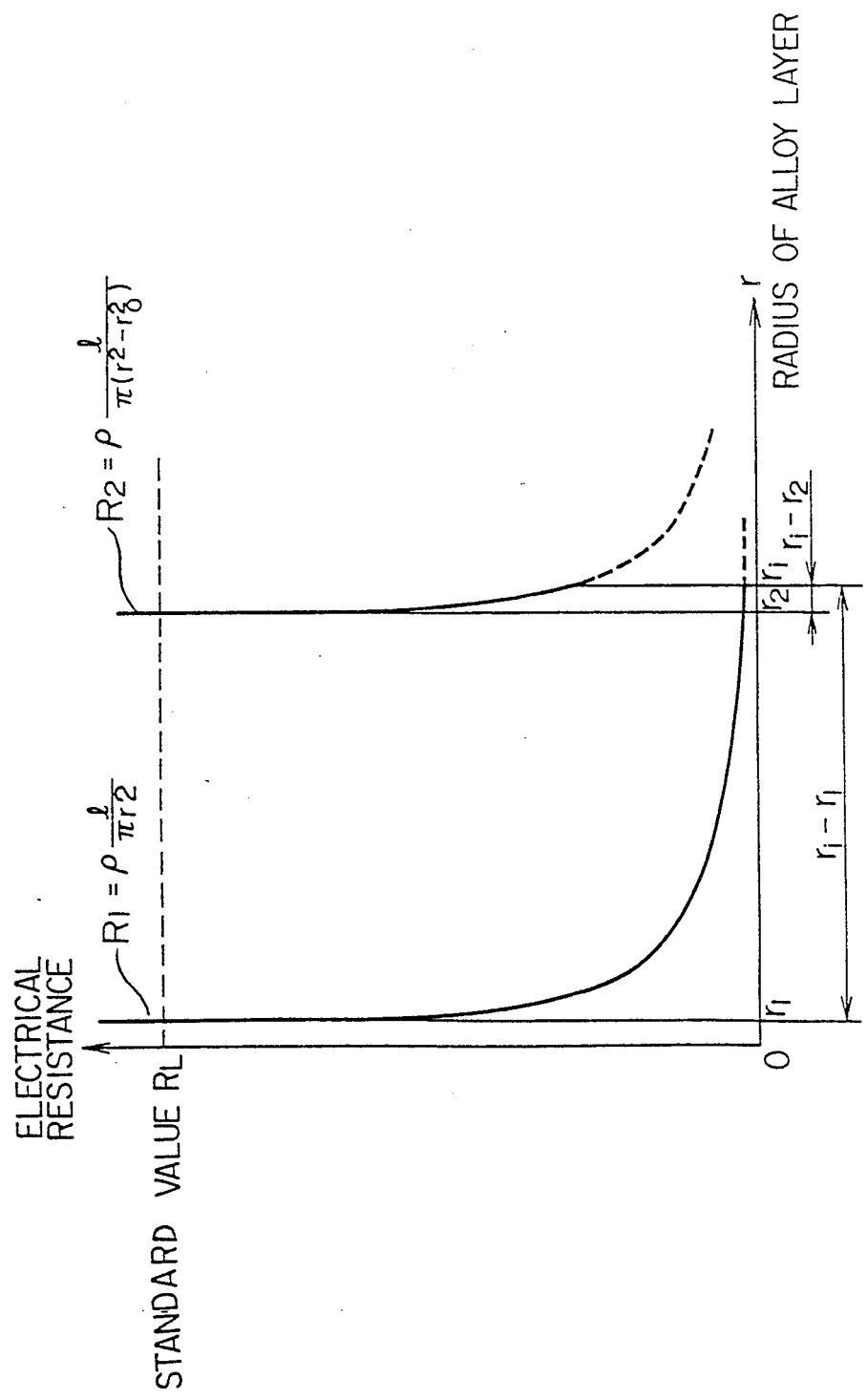
FIG. 8 is a graph illustrating the relationship between the radius of the alloy layer and its electrical resistance for the conventional structure and the structure of the present invention.

A comparison will now be made between an electrical resistance $R_1$ of the bonded portion of the present invention and an electrical resistance $R_2$ of the conventional bonded portion shown in FIG. 1. Assuming that the thickness of the alloy layer 3 in the structures of both cases is l, the radius of the normal part of the alloy layer 3 is r, and the radius of the aluminum 21 under the copper ball 1 which is separated from the aluminum 22 around the copper ball 1 in FIG. 1 is $r_0$, we have $$R_1 = \rho(l/\pi r^2), \quad R_2 = \rho\{l/\pi(r^2 - r_0^2)\}$$

where $\rho$ represents a resistivity of the alloy layer 3. FIG. 8 is a graph which shows the relationship between the electrical resistance and the radius of the alloy layer 3.

In FIG. 8, assuming that the standard, i.e., maximum acceptable, value of the electrical resistance is $R_L$, the corresponding radius of the alloy layer 3 is $r_1$ (the present invention) and $r_2$ (conventional example), and the initial radius of the normal part of the alloy layer 3 is $r_i$, a formula $r_1 < r_2$ always holds. In each of the cases, the reduced radius in which the initial electrical resistance exceeds the standard value $R_L$ is $(r_i - r_1)$ and $(r_i - r_2)$. So, it is clear that the reduced radius $(r_i - r_1)$ in the present invention is bigger than the reduced radius $(r_i - r_2)$ in the conventional example.

Figure 9:
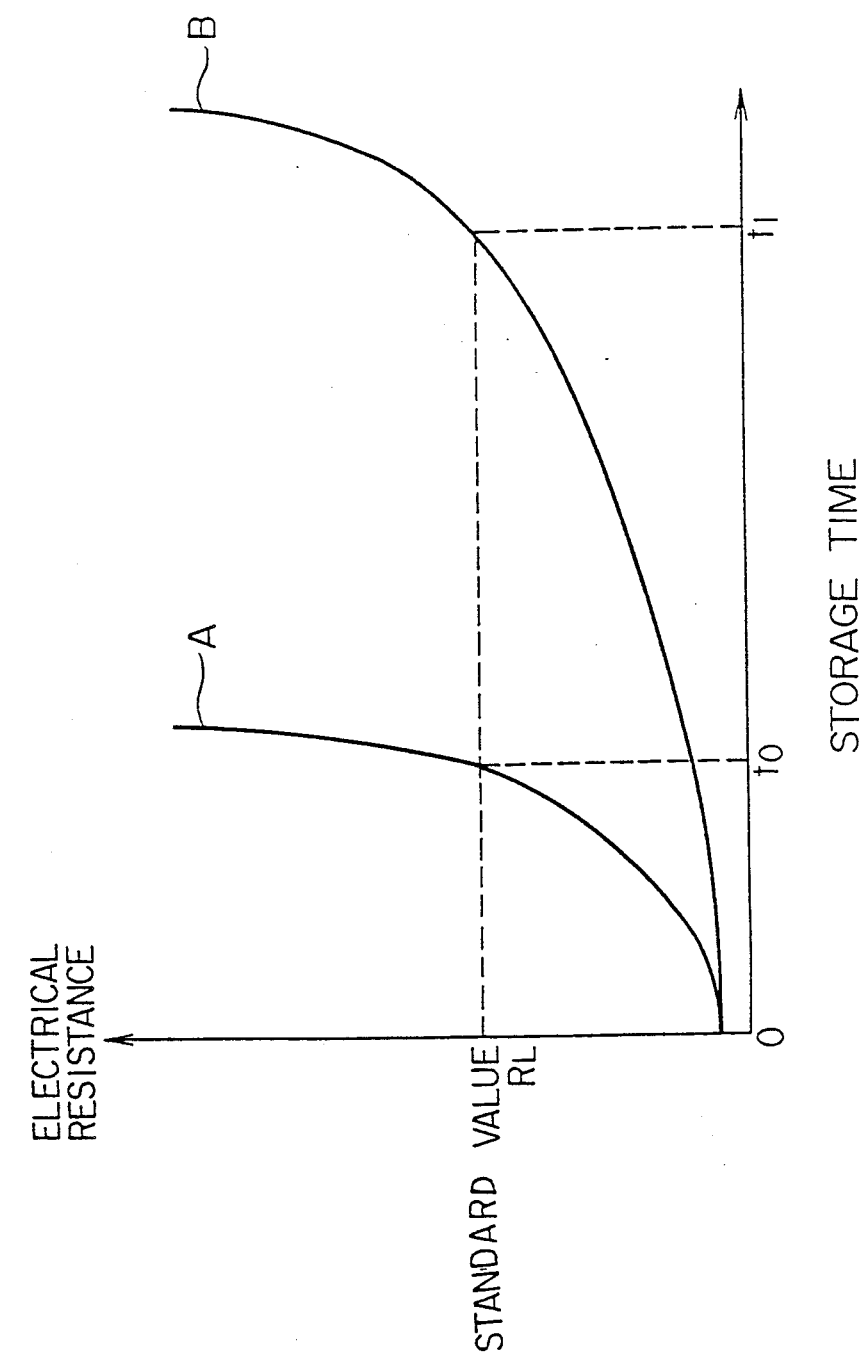
FIG. 9 is a graph illustrating the changes in electrical resistance with respect to storage time at a high temperature for the conventional structure and for the structure of the present invention.

FIG. 9 shows an example of the change of the electrical resistance with respect to the storage time for which the bonding structures of the conventional example and the present invention are stored at a temperature of 250° C. It is clear that the electrical resistance character (A) of the conventional structure exceeds the standard value $R_L$ in the time $t_0 \approx 8$ hours, but the resistance character (B) of the structure of the present invention exceeds it in the time $t_1 = 3 \times t_0$ hours.

This means that the device life time in the present invention can be several times longer than the conventional structure. The time $t_0$ is determined by component elements of the device such as semiconductor chip, molding resin, etcetera. In the above case, the time $t_0$ is 8 hours.

It should be noted that, although in the foregoing embodiment the composition of the electrode of the semiconductor chip is aluminum, it is possible for that electrode to contain several percentage of silicon and copper in aluminum.

What is claimed is:

1. A structure of an electrode junction for a semiconductor device comprising:
   an aluminum electrode layer disposed on a substrate;
   a copper ball at the end of a copper wire, said copper ball being bonded to a portion of said electrode layer; and
   a copper-aluminum alloy layer formed of aluminum from said aluminum electrode layer and copper from said copper ball during bonding of said copper ball to said aluminum electrode layer forming the interface of said copper ball with said aluminum electrode layer, said aluminum electrode layer underneath said copper ball being essentially continuous with the remainder of said aluminum electrode layer.

2. A structure according to claim 1 wherein said electrode layer contacts said alloy layer within at least 80% of the area of said alloy layer.

3. A structure according to claim 1 wherein said electrode layer is formed of pure aluminum.

4. A structure according to claim 1 wherein said electrode layer includes silicon.

5. A structure according to claim 1 wherein said electrode layer includes copper.

6. A semiconductor device including an aluminum electrode layer and a copper wire electrically connected to the aluminum electrode layer comprising:
   a semiconductor substrate;
   an electrically insulating film disposed on said substrate;
   an aluminum electrode layer disposed on said insulating film opposite said substrate;
   a copper wire including a copper ball bonded to a portion of said aluminum electrode layer; and
   a copper-aluminum alloy layer formed of aluminum from said aluminum electrode layer and copper from said copper ball during bonding of said copper ball to said aluminum electrode layer with said copper ball, the portion of said aluminum electrode layer underneath said copper ball being essentially continuous with the remainder of said aluminum electrode layer.

7. The semiconductor device of claim 6 wherein said electrode layer contacts said alloy layer over not less than 80% of the area of said alloy layer.

* * * * *

UNITED STATES PATENT AND TRADEMARK OFFICE
CERTIFICATE OF CORRECTION

PATENT NO. : 5,003,373

DATED : March 26, 1991

INVENTOR(S) : Tsumura et al.

It is certified that error appears in the above-identified patent and that said Letters Patent is hereby corrected as shown below:

Column 6, line 4, after "layer" insert --forming the interface of said aluminum electrode layer--.

Signed and Sealed this

First Day of September, 1992

Attest:

DOUGLAS B. COMER

*Attesting Officer*     *Acting Commissioner of Patents and Trademarks*